(12) United States Patent
Yamada

(10) Patent No.: US 8,330,847 B2
(45) Date of Patent: Dec. 11, 2012

(54) SOLID-STATE IMAGING DEVICE WITH IMPROVED LIGHT USE EFFICIENCY

(75) Inventor: Daisuke Yamada, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/903,451

(22) Filed: Oct. 13, 2010

(65) Prior Publication Data

US 2011/0090384 A1    Apr. 21, 2011

(30) Foreign Application Priority Data

Oct. 21, 2009 (JP) ................................. 2009-242053

(51) Int. Cl.
*H04N 5/225* (2006.01)

(52) U.S. Cl. ........................................ 348/340; 348/344

(58) Field of Classification Search .................. 348/340, 348/344; 257/98, 226, 233, 294, 436; 250/208.1
See application file for complete search history.

(56) References Cited

U.S. PATENT DOCUMENTS

| | | | | |
|---|---|---|---|---|
| 6,489,992 B2 * | 12/2002 | Savoye | .......................... | 348/340 |
| 7,110,034 B2 * | 9/2006 | Suda | .............................. | 348/340 |
| 7,245,324 B2 * | 7/2007 | Namazue et al. | ............. | 348/340 |
| 7,250,973 B2 * | 7/2007 | Dobashi et al. | ............... | 348/340 |
| 7,507,945 B2 * | 3/2009 | Kuroiwa | ..................... | 250/208.1 |
| 7,615,732 B2 * | 11/2009 | Tani | ............................... | 250/216 |
| 2003/0063210 A1 * | 4/2003 | Tsuboi | .......................... | 348/340 |
| 2004/0165097 A1 * | 8/2004 | Drowley et al. | .............. | 348/340 |
| 2009/0008683 A1 | 1/2009 | Nishizawa | | |
| 2010/0032659 A1 * | 2/2010 | Yoshida | .......................... | 257/40 |
| 2010/0110271 A1 * | 5/2010 | Yanagita et al. | .............. | 348/340 |
| 2010/0148290 A1 * | 6/2010 | Park | .............................. | 257/432 |
| 2010/0201834 A1 * | 8/2010 | Maruyama et al. | ......... | 348/222.1 |

FOREIGN PATENT DOCUMENTS

| | | |
|---|---|---|
| JP | 61-024272 | 2/1986 |
| JP | 2007-027604 | 2/2007 |

* cited by examiner

*Primary Examiner* — Kelly L Jerabek

(74) *Attorney, Agent, or Firm* — Fitzpatrick, Cella, Harper & Scinto

(57) ABSTRACT

Provided is a solid-state imaging device capable of reducing occurrence of noise resulting from reflected light to improve light use efficiency in a case where a solid-state imaging device is constructed to have a structure in which incident light passing through a substrate is reflected toward a photoelectric conversion unit. The solid-state imaging device includes: a photoelectric conversion unit formed in an inner portion of a substrate; a condensing unit provided on a side of the substrate which incident light enters, for condensing the incident light to the photoelectric conversion unit; and a reflecting unit provided on a side of the substrate which is opposed to the condensing unit, the reflecting unit being concave to the substrate, in which the reflecting unit has a structure for substantially aligning a same magnification imaging position of the reflecting unit with a focusing position of the condensing unit.

7 Claims, 9 Drawing Sheets

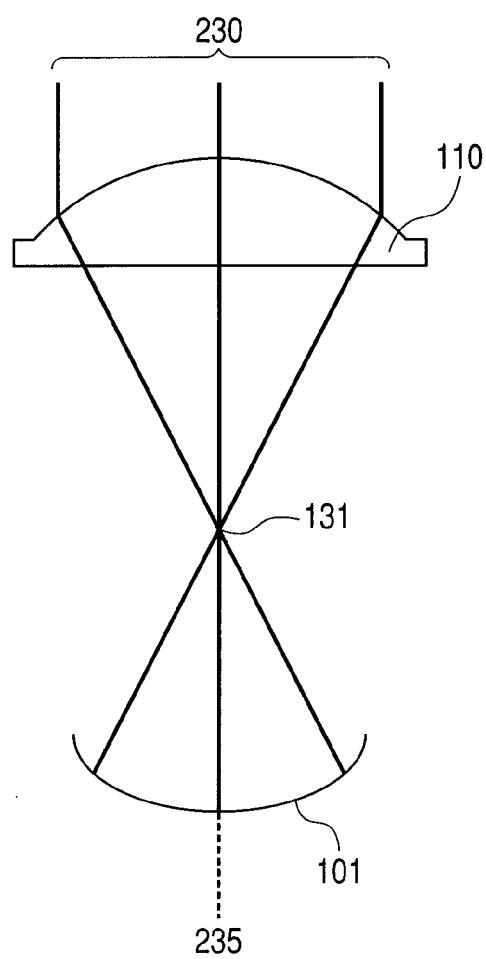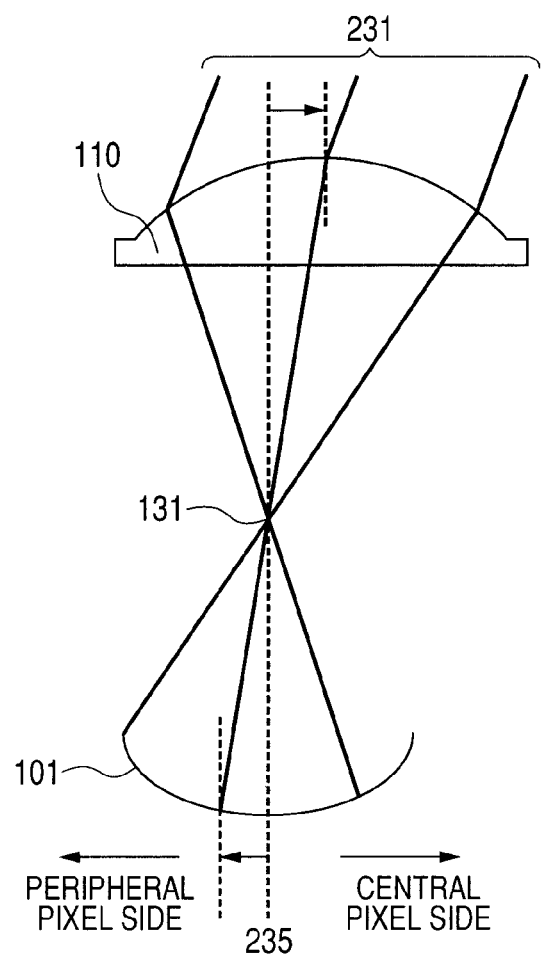

SOLID-STATE IMAGING DEVICE WITH IMPROVED LIGHT USE EFFICIENCY

BACKGROUND OF THE INVENTION

1. Field of the Invention

The present invention relates to a solid-state imaging device, and more particularly, to a solid-state imaging device used for an imaging apparatus, for example, a digital still camera.

2. Description of the Related Art

In recent years, a solid-state imaging device in which multiple CCDs or CMOS elements are two-dimensionally arranged has been used for a digital video camera and a digital still camera. The solid-state imaging device is manufactured as follows. A photoelectric conversion unit and a diffusion unit are formed in a substrate by impurity introduction, for example, ion implantation. After that, films are deposited on the substrate and processed to form wiring parts and insulating films. Incident light entering the solid-state imaging device is absorbed in the photoelectric conversion unit and converted into charges. The charges are stored in the photoelectric conversion unit. When a total amount of the stored charges is detected, a signal corresponding to an intensity of the incident light may be obtained.

However, when a penetration length of the incident light is longer than a length of the substrate, the incident light is not sufficiently absorbed in the photoelectric conversion unit, and thus a part of the incident light passes through the substrate. Therefore, the part of the incident light cannot be converted into a charge signal, and hence light use efficiency is reduced. In order to solve such a problem, an imaging apparatus in which the light passing through the substrate is reflected toward the photoelectric conversion unit again has been proposed in Japanese Patent Application Laid-Open No. 2007-027604. Note that, the penetration length of the incident light indicates a propagation length to reduce a light intensity to 1/e of the incident light intensity by absorption loss.

However, as illustrated in FIG. 10, in a reflecting film structure of the imaging apparatus described in Japanese Patent Application Laid-Open No. 2007-027604, incident light beams 930 refracted by a micro-lens 910 are reflected on a reflecting film 901 and propagate to adjacent pixels. Therefore, noise, (e.g., crosstalk) is caused by the reflected light beams, and hence an S/N ratio of an image is reduced.

SUMMARY OF THE INVENTION

The present invention has been made in view of the problem described above. An object of the present invention is to provide a solid-state imaging device capable of reducing occurrence of noise resulting from reflected light to improve light use efficiency in a case where a solid-state imaging device is constructed to have a structure in which incident light passing through a substrate is reflected toward a photoelectric conversion unit.

The present invention provides a solid-state imaging device configured as follows. The solid-state imaging device comprises a photoelectric conversion unit formed in an inner portion of a substrate, a condensing unit provided on a side of the substrate which incident light enters, for condensing the incident light to the photoelectric conversion unit, and a reflecting unit provided on a side of the substrate which is opposed to the condensing unit, the reflecting unit being concave to the substrate, wherein the reflecting unit has a structure for substantially aligning a same magnification imaging position of the reflecting unit with a focusing position of the condensing unit.

According to the present invention, a solid-state imaging device capable of reducing occurrence of noise resulting from reflected light to improve light use efficiency in a case where a solid-state imaging device is constructed to have a structure in which incident light passing through a substrate is reflected toward a photoelectric conversion unit may be realized.

Further features of the present invention will become apparent from the following description of exemplary embodiments with reference to the attached drawings.

BRIEF DESCRIPTION OF THE DRAWINGS

FIG. 8A is a schematic view illustrating an optical configuration including light beams and a micro-lens at a central pixel in Embodiment 2 of the present invention.

FIG. 8B is a schematic view illustrating an optical configuration including light beams and the micro-lens at a peripheral pixel in Embodiment 2 of the present invention.

DESCRIPTION OF THE EMBODIMENTS

Preferred embodiments of the present invention will now be described in detail in accordance with the accompanying drawings. In all the drawings for the following embodiments, constituent elements having the same functions are expressed by the same symbols and the descriptions of the duplicated constituent elements are omitted.

(Embodiment 1)

Figure 1:
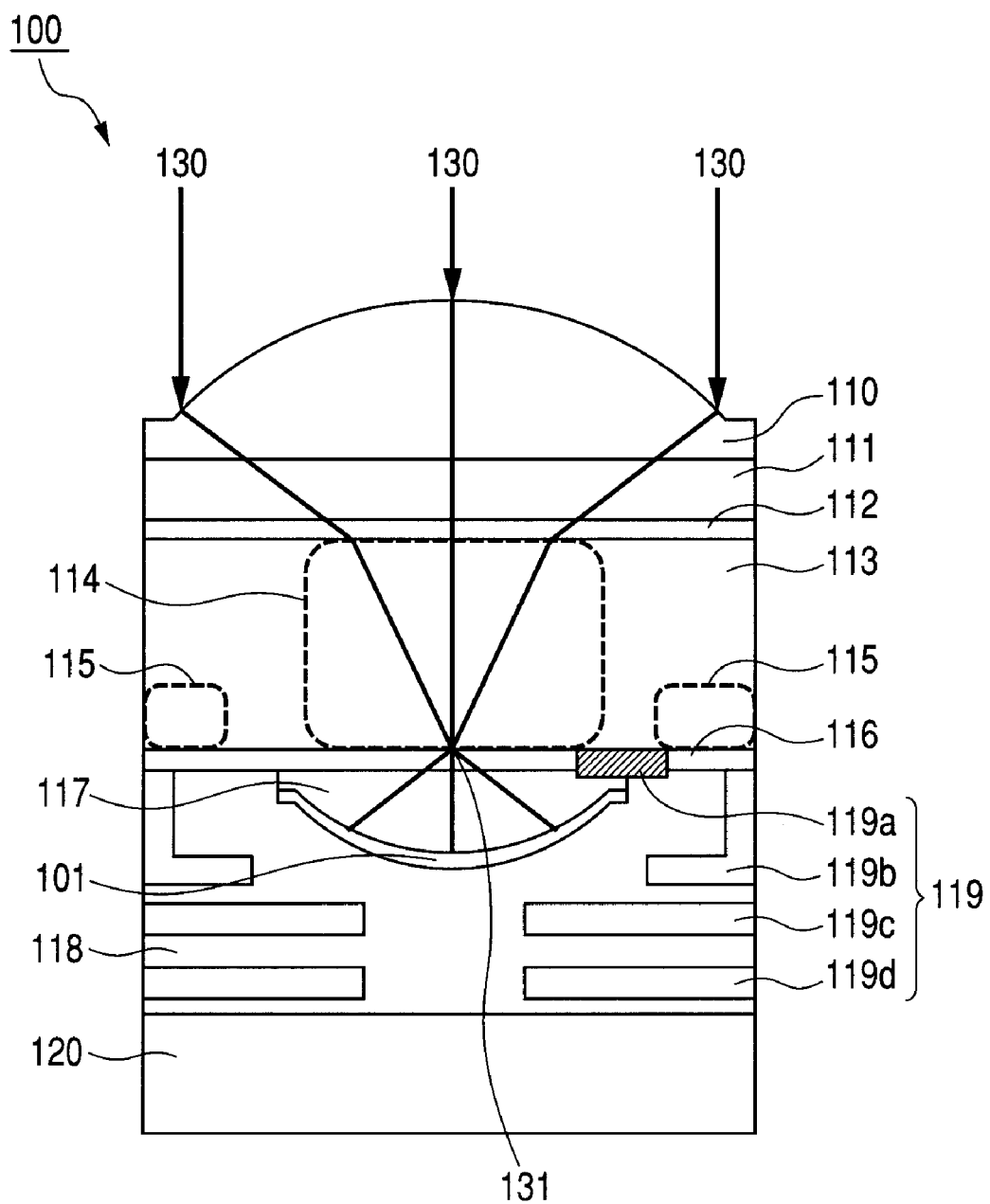
FIG. 1 is a cross sectional view illustrating a structural example of a back illuminated CMOS imaging device according to Embodiment 1 of the present invention.

A structural example of a back illuminated CMOS imaging device to which the present invention is applied is described with reference to FIG. 1. In FIG. 1, a back illuminated CMOS imaging device 100 is provided. A substrate 113 includes a photoelectric conversion unit 114 provided for each pixel in an inner portion of the substrate 113. A reflecting unit 101 is concave to the substrate 113 and has a specific curvature radius. A micro-lens 110 serving as a condensing unit is provided closer to a light incident side than the substrate 113. The imaging device according to this embodiment includes a color filter 111, an insulating unit 112, diffusion units 115, an antireflection layer 116, a convex insulating unit 117, an interlayer insulating film 118, a wiring unit 119, and a support substrate 120. The wiring unit 119 includes a gate electrode 119a and three wiring parts 119b, 119c, and 119d.

Incident light 130 is condensed by the micro-lens 110 and imaged in a focusing position 131. A part of the incident light 130 passes through the photoelectric conversion unit 114 and is reflected on the reflecting unit 101 which is concave. A structure is provided so that a same magnification imaging position of reflected light may correspond with the focusing position 131 of the micro-lens 110. Therefore, the reflected light is imaged in the focusing position 131 again. In such a structure, all light beams reaching the reflecting unit 101 are reflected light beams, and hence the reflected light beams reversely travel on substantially the same optical path as the incident light. Thus, all the reflected light beams enter the photoelectric conversion unit 114 again, and hence the sensitivity of the solid-state imaging device is improved.

In contrast to this, for example, when a structure is employed in which incident light and reflected light do not pass through the same optical path, a part of the reflected light propagates to adjacent pixels and is scattered by the wiring unit 119 and the like, and thus causes noise, for example, crosstalk. In particular, in a case of a solid-state imaging device including a micro-lens, an incident angle on the photoelectric conversion unit is large. Therefore, even when incident light is merely reflected, the reflected light does not pass through the photoelectric conversion unit, and thus is more likely to propagate to adjacent pixels. When a pixel size of the solid-state imaging device reduces, a distance from adjacent pixels further shortens, and hence noise, for example, crosstalk becomes larger.

In this embodiment, as described above, the reflecting unit 101 is provided so that the incident light and the reflected light pass through the same optical path. Therefore, with respect to the incident light 130, noise, for example, crosstalk is reduced and a propagation distance in the photoelectric conversion unit 114 is lengthened to improve the light use efficiency. Thus, an S/N ratio of an image may be improved.

Figure 2:
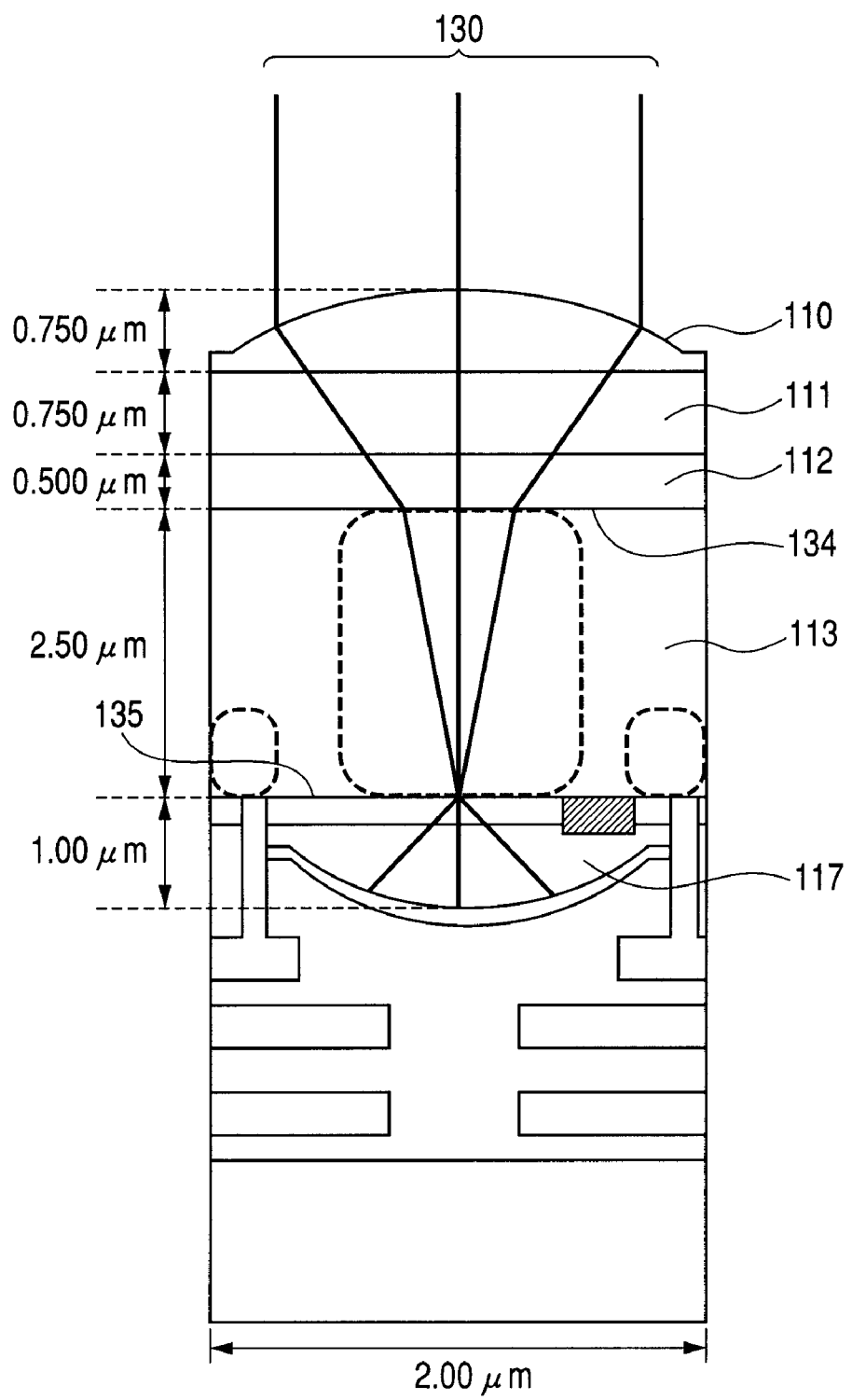
FIG. 2 is a cross sectional view illustrating a numerical example of a solid-state imaging device for visible light according to Embodiment 1 of the present invention.

A numerical example of a solid-state imaging device for visible light is described with reference to FIG. 2. A pixel size is 2.00 µm. The substrate 113 is made of silicon and has a thickness of 2.50 µm. Assume that a light incident side surface of the substrate 113 is a first surface 134, and a surface of the substrate 113 which is located on a side on which the reflecting unit 101 is provided is a second surface 135. The micro-lens 110, the color filter 111, the insulating unit 112, and the convex insulating unit 117 each have a refractive index of 1.50, and respective thicknesses thereof at the center of the pixel are 0.750 µm, 0.750 µm, 0.500 µm, and 1.00 µm. The incident light 130 efficiently enters the photoelectric conversion unit 114 in the substrate 113. Therefore, a curvature radius of the micro-lens 110 is set to 0.979 µm so that the focusing position 131 is located at the center of the photoelectric conversion unit 114 and in the interface (second surface 135) between the substrate 113 and the antireflection layer 116. The curvature radius of the reflecting unit 101 is set to 1.00 µm so that all light beams entering the micro-lens 110 at multiple incident angles are reflected on the reflecting unit 101 to reversely travel to the same focusing position 131. Such a structure is employed, and hence a same magnification imaging position of the reflecting unit 101 and the focusing position (condensing position) of the micro-lens (condensing unit) 110 correspond with each other on the second surface 135.

Figure 3:
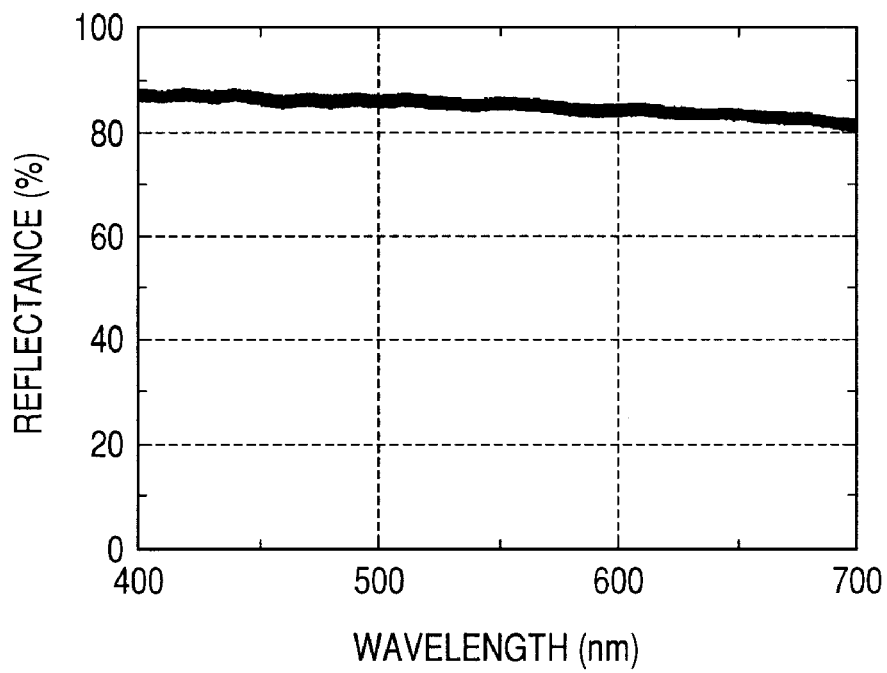
FIG. 3 is a graph showing reflectance on a reflecting unit of the imaging device according to Embodiment 1 of the present invention.
Figure 4:
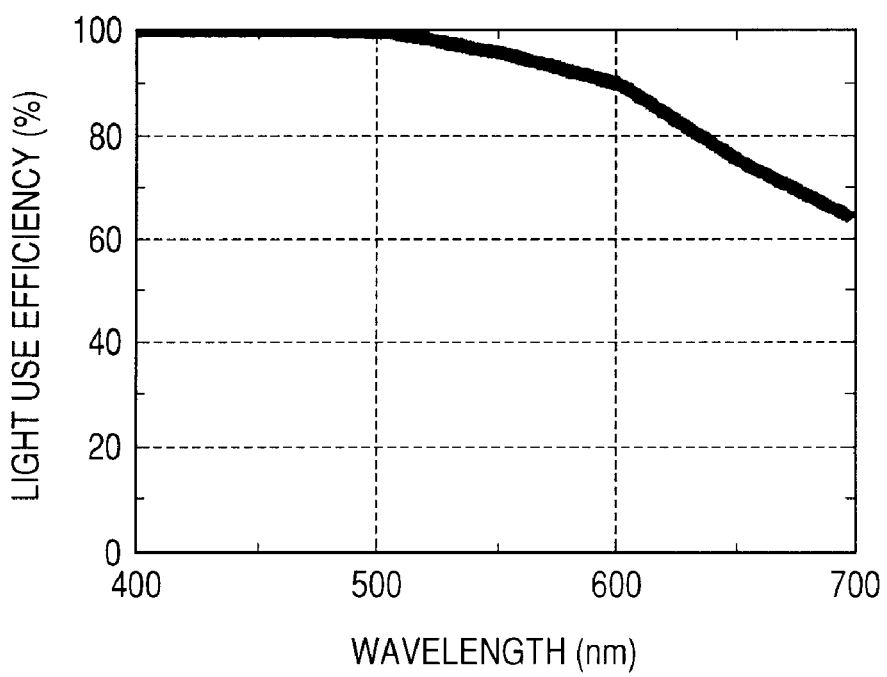
FIG. 4 is a graph showing light use efficiency of the imaging device according to Embodiment 1 of the present invention.
Figure 5:
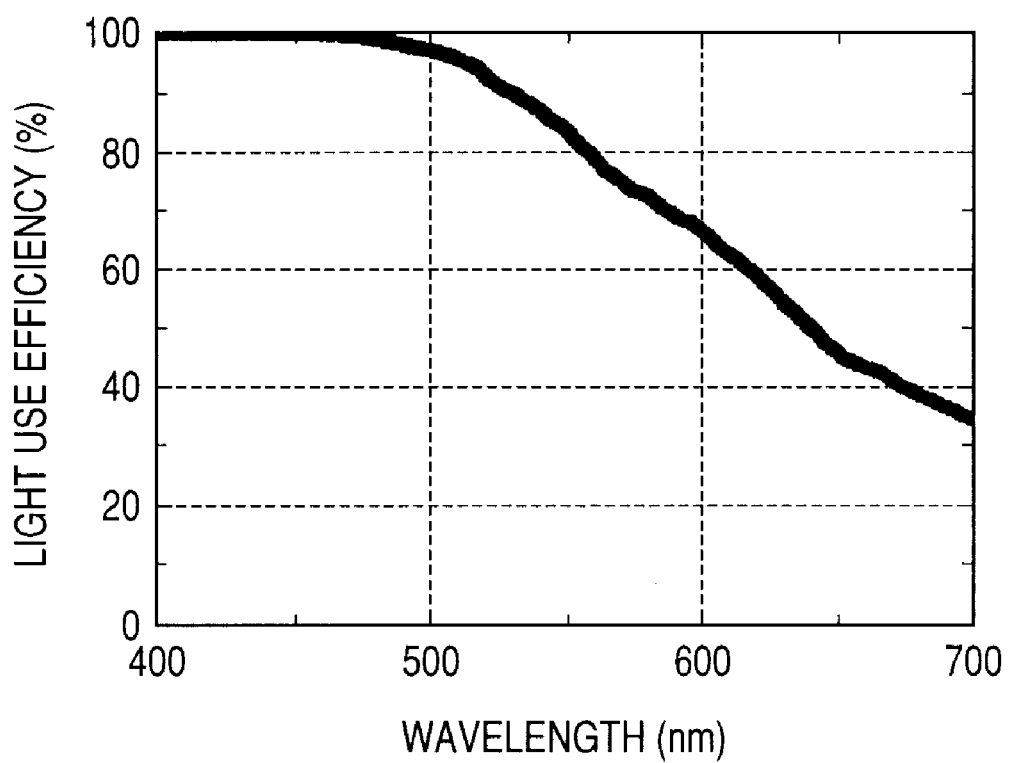
FIG. 5 is a graph showing light use efficiency of a solid-state imaging device in a case where the reflecting unit is not provided.

In this embodiment, the reflecting unit 101 is formed by depositing aluminum on a surface of the convex insulating unit 117. Therefore, the reflecting unit 101 having a reflectance as illustrated in FIG. 3 is obtained, and hence a reflectance equal to or larger than 80% may be obtained in a visible light region. FIG. 4 illustrates light use efficiency of the solid-state imaging device in this case. FIG. 5 illustrates light use efficiency of a solid-state imaging device in a case where the reflecting unit 101 is not provided. When the reflecting unit 101 is provided, the light use efficiency is high on a longer wavelength side than a wavelength of 500 nm. In particular, light use efficiency at a wavelength of 700 nm is approximately 1.5 times higher than light use efficiency in the case where the reflecting unit 101 is not provided. Note that, an absorbance of the color filter 111 is not related to the essence of the present invention, and hence the light use efficiency is estimated on the assumption that the absorbance of the color filter 111 is zero. Therefore, when the same magnification imaging position of the reflecting unit 101 and the focusing position of the micro-lens 110 correspond with each other, the light use efficiency may be improved to increase sensitivity. The reflected light on the reflecting unit 101 reversely travel on substantially the same optical path as the incident light, and hence scattering of light caused by the wiring unit 119 may be reduced to suppress crosstalk. Thus, an S/N ratio of an image is improved.

In this embodiment, the reflecting unit of the solid-state imaging device is made of metal, but not necessarily made of metal, and thus may include a reflecting film made of dielectric. Even in the case where the reflecting film is made of dielectric, when the reflecting film may reflect the incident light, the light use efficiency is similarly improved. However, when the reflecting film is made of dielectric, it is difficult to increase a refractive index difference in view of material selectivity, and hence high reflectance is not obtained. When a multi-layer dielectric film is used as the reflecting film, high reflectance cannot be obtained in the entire visible light region because of large wavelength dependence. On the other hand, when metal is used, the wavelength dependence is small, and high reflectance may be obtained. Therefore, metal is desired to be used for the reflecting unit because the light use efficiency is improved. In this embodiment, the solid-state imaging device is of the back illuminated in which the wiring unit 119 is provided on a side of the substrate 113 which is opposed to the micro-lens 110. However, the back illuminated is not necessarily employed. A front illuminated may be employed in which the micro-lens and the wiring unit are provided on the same side. Even in the case of the front illuminated solid-state imaging device, when the structure according to the present invention is employed, the light use efficiency is improved as in the case of the back illuminated solid-state imaging device. However, in the case of the front illuminated solid-state imaging device, it is difficult to form the support substrate on the incident light side, and hence it is difficult to thin the substrate to form the reflecting unit on a side opposed to the incident light side. In contrast to this, as described later, in the case of the back illuminated solid-state imaging device, the support substrate may be bonded to the side opposed to the incident light side to thin the substrate. Therefore, the back illuminated solid-state imaging device may be easier to be manufactured, and thus is more desired.

In this embodiment, the focusing position 131 of the micro-lens 110 and the same magnification imaging position of the reflecting unit 101 are set on the second surface 135 of the substrate 113 which is located on the side on which the reflecting unit is provided, but not necessarily set on the second surface of the substrate. Even in a case where the incident light is imaged in the substrate 113 or an outer portion of the substrate 113, when the incident light 130 propagates through the photoelectric conversion unit 114, the incident light is detected as the charge signal. However, in the case of the back illuminated solid-state imaging device, the diffusion layers 115 corresponding to drain regions of transistors for transferring charges obtained by the photoelectric conversion unit 114 are formed on the second surface 135 side of the substrate 113. When the incident light propagates to the diffusion units 115, charges are generated in the diffusion units 115. The charges cause noises, for example, white point noise. Therefore, in order to prevent the light from entering the diffusion unit 115, the incident light is desired to be imaged on the second surface 135. In this embodiment, the structure is employed, in which the wiring unit 119 includes the multiple wiring parts 119b, 119c, and 119d and the reflecting unit 101 is provided closer to the substrate 113 than the wiring parts 119b, 119c, and 119d. However, such structure is not necessarily employed. Even when a structure is employed, in which the reflecting unit 101 is provided closer to the support substrate 120 than the wiring parts 119b, 119c, and 119d, the incident light passing through the photoelectric conversion unit 114 may be reflected on the reflecting unit 101 to travel to the photoelectric conversion unit 114, and hence the light use efficiency is improved. Note that, the light passing through the photoelectric conversion unit 114 propagates while spreading out, and hence a part of the light is scattered by the wiring parts 119b, 119c, and 119d before the light reaches the reflecting unit 101. When the scattered light reaches a photoelectric conversion unit of an adjacent pixel, the light becomes crosstalk. Therefore, the reflecting unit 101 is desired to be provided closer to the substrate 113 than the wiring parts 119b, 119c, and 119d.

Figure 10:
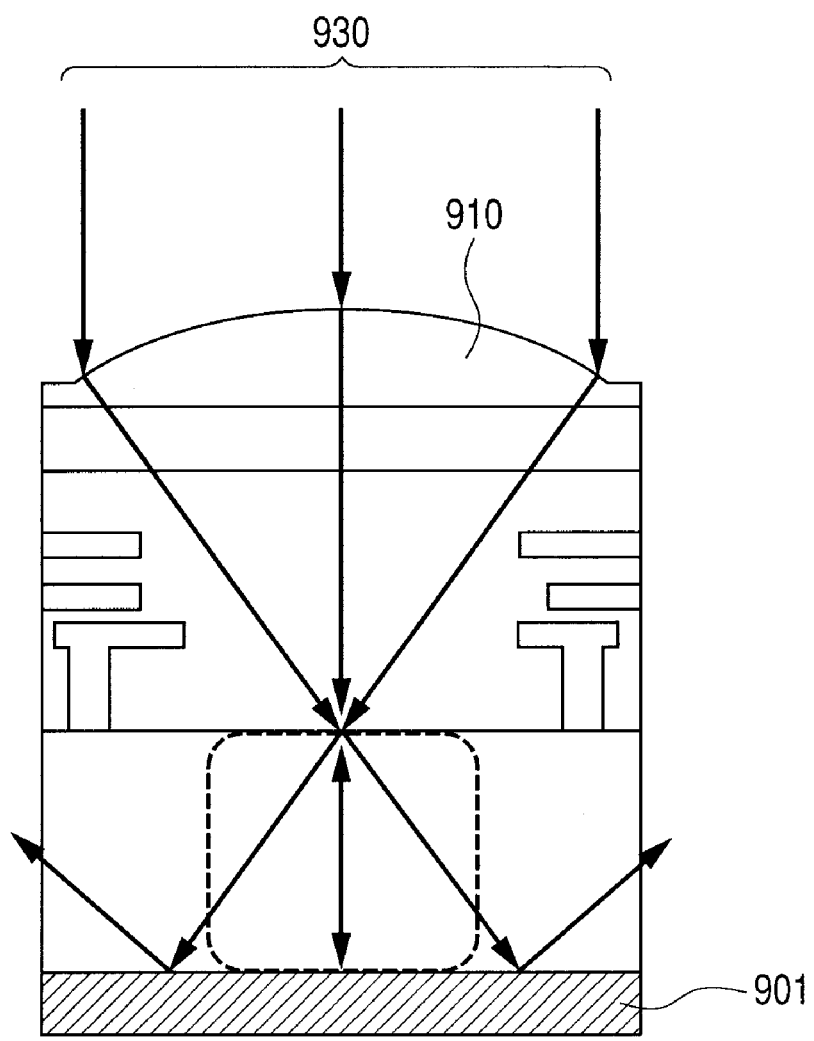
FIG. 10 illustrates a structure of a solid-state imaging device according to a conventional example.

In this embodiment, the wiring parts 119b, 119c, and 119d and the reflecting unit 101 are made of aluminum, but not necessarily made of the same material. For example, even when the wiring parts 119b, 119c, and 119d are made of copper and the reflecting unit 101 is made of aluminum, the effect of the present invention is obtained. Note that, the same material is desired to be used because a manufacturing cost may be reduced. In this embodiment, the antireflection layer 116 is formed between the substrate 113 and the convex insulating unit 117. Even when the antireflection layer 116 is not provided, the light passing through the photoelectric conversion unit 114 is reflected on the reflecting unit 101 and enters the photoelectric conversion unit 114 again, and hence the light use efficiency is improved. However, as in the case of the reflected light reflected on the reflecting film 901 illustrated in FIG. 10, reflected light at an interface between the substrate 113 and the convex insulating unit 117 is not condensed to the photoelectric conversion unit 114 and propagates to the diffusion layers 115 or adjacent pixels. Therefore, the reflected light causes white point noise or crosstalk, to thereby reduce an S/N ratio of an image. Thus, the antireflection layer 116 is desired to be formed between the substrate 113 and the convex insulating unit 117 to suppress the reflected light at the interface.

(Embodiment 2)

In this embodiment, a structural example of a CMOS imaging device having a two-dimensional arrangement structure to which the present invention is applied is described with reference to FIGS. 6, 7A and 7B. In this embodiment, a solid-state imaging device 200 illustrated in FIG. 6 has a structure in which multiple pixels 210 each including the photoelectric conversion unit 114 are two-dimensionally arranged (FIG. 7A). In this case, a distance between an exit pupil 211 of a camera lens and the solid-state imaging device 200 is normally finite, and hence principal rays (incident light beams) 231 obliquely enter peripheral pixels (FIG. 7B). Therefore, in each of the peripheral pixels, in order to make the incident light beams to efficiently enter the photoelectric conversion unit 114, the condensing unit, for example, the micro-lens, for refracting the incident light beams to the photoelectric conversion unit 114 is required. When the condensing unit is not used, the obliquely incident light beams propagate to the adjacent pixels to cause crosstalk.

Figure 6:
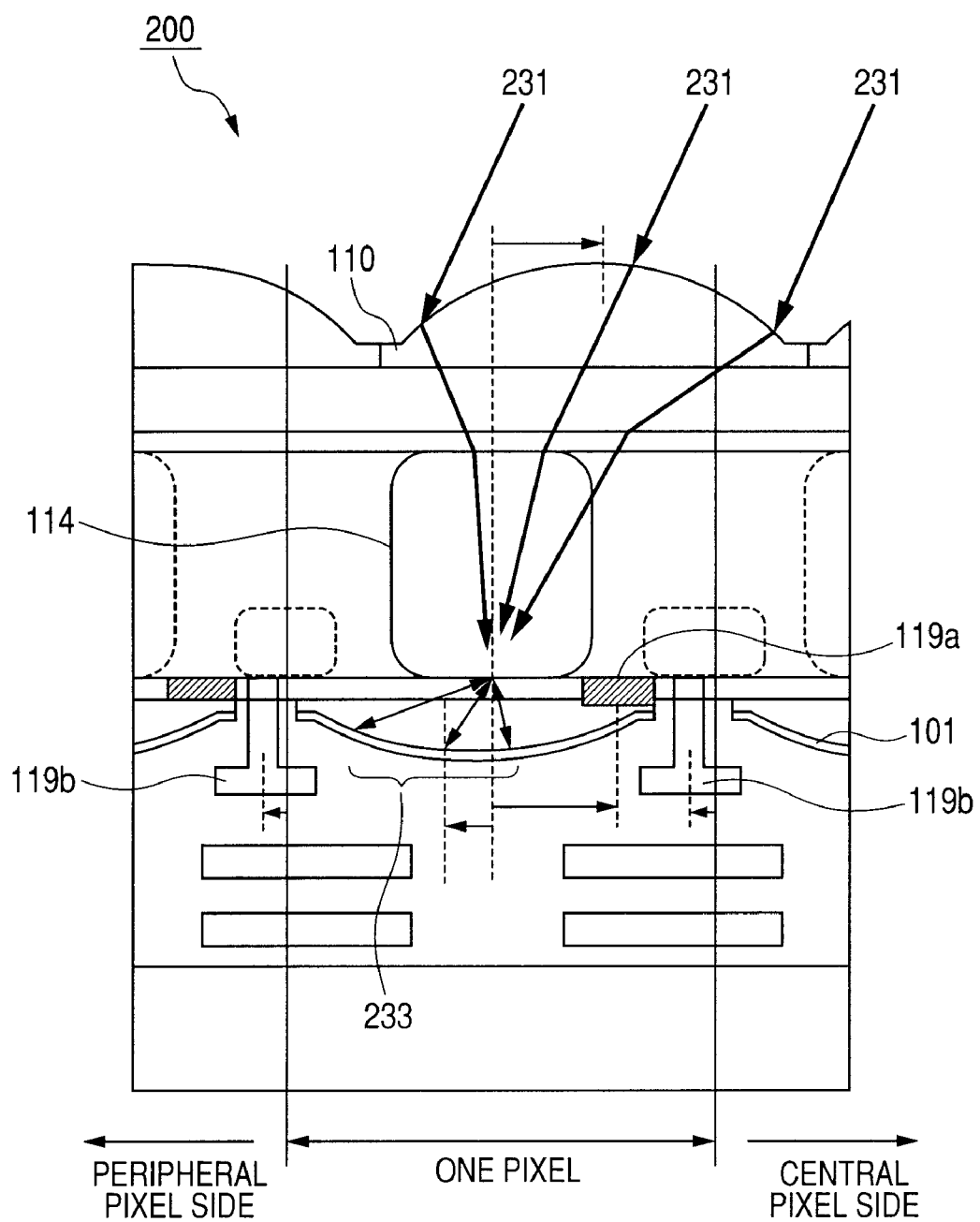
FIG. 6 is a cross sectional view illustrating a structural example of a CMOS imaging device having a two-dimensional arrangement structure according to Embodiment 2 of the present invention.
Figure 7A:
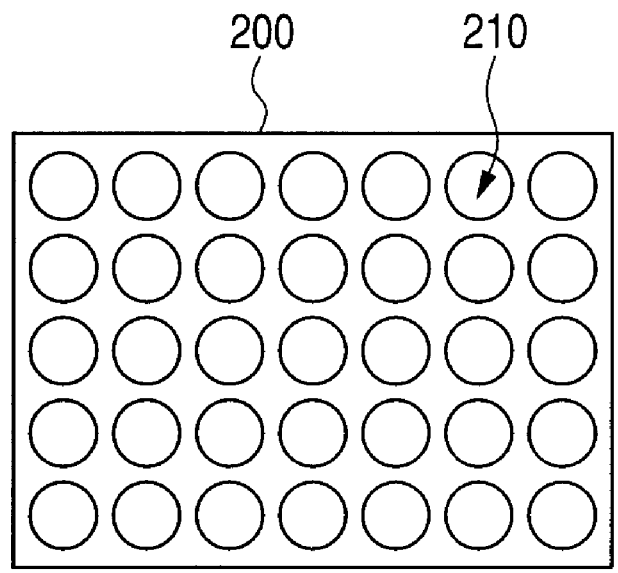
FIG. 7A illustrates a structural example of the CMOS imaging device in which pixels are two-dimensionally arranged according to Embodiment 2 of the present invention.
Figure 7B:
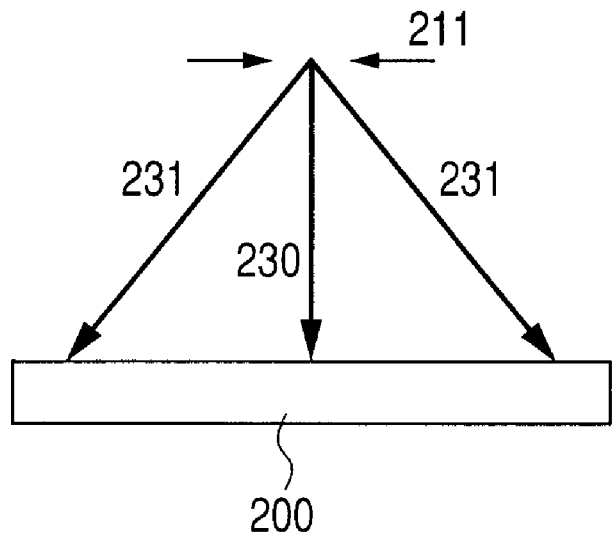
FIG. 7B illustrates a structural example of the CMOS imaging device in which pixels are two-dimensionally arranged according to Embodiment 2 of the present invention.

FIG. 6 illustrates a structure in which the incident light beams 231 are condensed by the micro-lens 110 and light beams reflected on the reflecting unit 101 reversely travel on the same optical path as the incident light beams. Therefore, the reflected light beams enter the photoelectric conversion unit 114 again, and hence the sensitivity of the solid-state imaging device is improved. In contrast to this, for example, assume that a structure in which the incident light beams and the reflected light beams do not pass through the same optical path is employed. When particularly the principal rays 231 are tilted, the reflected light beams on the reflecting unit do not pass through the photoelectric conversion unit, but propagate to adjacent pixels located in the direction corresponding to the tilt of the principal rays. This causes noise, for example, crosstalk. In particular, when the structure is employed, in which the condensing unit for condensing the incident light beams is not used, the reflected light beams are spread out in the inner portion of the solid-state imaging device, and hence noise, for example, crosstalk becomes larger.

As described above, the reflecting unit 101 is provided so that the incident light beams and the reflected light beams have the same optical path. Therefore, with respect to the incident light beams 231, noise, for example, crosstalk is reduced and a propagation distance in the photoelectric conversion unit is lengthened to improve the light use efficiency. Thus, an S/N ratio of an image may be improved.

Next, a structure for aligning an optical path of incident light with an optical path of reflected light in the case where a principal ray is tilted is described. FIG. 8A is a schematic view illustrating an optical configuration including light beams and a micro-lens at a central pixel and FIG. 8B is a schematic view illustrating an optical configuration including light beams and the micro-lens at a peripheral pixel. In a case of the central pixel, incident light beams 230 vertically enter the solid-state imaging device, and hence the focusing position 131 is located on a central axis 235 of the central pixel (FIG. 8A). On the other hand, in a case of the peripheral pixel, the incident light beams 231 obliquely enter the solid-state imaging device, and hence a focusing position is not located on a central axis of the peripheral pixel. That is, the focusing position is deviated from the central axis to a side opposed to a central pixel side. Therefore, when the micro-lens 110 is shifted from the central axis of the peripheral pixel to the central pixel side, the focusing position 131 may be shifted to the central axis 235 of the peripheral pixel (FIG. 8B).

When the micro-lens 110 is shifted to the central pixel side as described above, the focusing position of each pixel may be aligned with the central axis 235 of each corresponding pixel. In this case, the center of curvature of the reflecting unit 101 is aligned with the focusing position 131. In this manner, a design may be made so that the center of curvature of the reflecting unit 101 in each pixel is aligned with the central axis 235 of each corresponding pixel which is the focusing position of the incident light, and the reflected light has the same optical path as the incident light. In this case, the reflecting unit 101 may be designed to have the same structure for each pixel, and thus may be designed separately from the micro-lens 110. Note that, when the micro-lens 110 is not shifted to the central pixel side but the center of curvature of the reflecting unit 101 is shifted in plane, the focusing position and the same magnification imaging position are aligned with each other. Even in such a case, the improvement effect in the light use efficiency of the present invention is obtained. However, when the focusing position is not located on the central axis of the pixel, the light passing through the photoelectric conversion unit propagate while spreading out, and hence scattering of light is caused by the wiring units 119. Scattering light causes crosstalk, to thereby reduce an S/N ratio of an image. Thus, the micro-lens 110 is desired to be shifted to align the focusing position of the micro-lens 110 with the same magnification imaging position of the reflecting unit on the central axis of the pixel, to thereby increase the S/N ratio of the image.

In this case, as illustrated in FIG. 6, transmission light 233 entering from the photoelectric conversion unit 114 side propagates to the peripheral pixel side. In order to reflect the transmission light 233, it is necessary to significantly extend the reflecting unit 101 to the peripheral pixel side. However, when the reflecting unit 101 is significantly extended to the peripheral pixel side, the reflecting unit 101 and the wiring part 119b become closer to each other, and thus are electrically connected to each other. In this case, the solid-state imaging device 200 does not normally operate. Thus, the wiring part 119b is shifted from the central axis of the peripheral pixel to the side opposed to the central pixel side to lengthen a distance between the reflecting unit 101 and the wiring part 119b, to thereby insulate the reflecting unit and the wiring part from each other. As described above, in the peripheral pixel, even in the case where the reflecting unit 101 is extended to the peripheral pixel side, when the wiring part 119b is shifted to the peripheral pixel side, a solid-state imaging device having high sensitivity and small noise may be obtained. In this embodiment, because the gate electrode 119a is disposed so as to be shifted from the central axis of the peripheral pixel to the central pixel side, the transmission light 233 propagates to the peripheral pixel side, and thus the transmission light 233 is less likely to enter the gate electrode 119a. The gate electrode 119a is normally made of polysilicon. Therefore, when the transmission light enters the gate electrode 119a, the transmission light is absorbed, and hence the amount of light entering the photoelectric conversion unit 114 again reduces. Thus, the gate electrode 119a is desired to be shifted from the central axis of the peripheral pixel to the central pixel side to improve the light use efficiency.

(Embodiment 3)

Figure 9A:
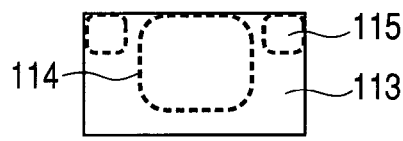
FIG. 9A illustrates a method of manufacturing a back illuminated CMOS imaging device according to Embodiment 3 of the present invention.

In Embodiment 3, an example of a method of manufacturing the back illuminated CMOS imaging device to which the present invention is applied is described with reference to FIGS. 9A, 9B, 9C, 9D, 9E, 9F, 9G, and 9H. In the manufacturing method according to this embodiment, first, a silicon oxide layer is formed on a surface of the substrate 113 made of silicon by thermal oxidation. Subsequently, in order to form the photoelectric conversion unit 114 in the substrate 113, a resist mask is formed at a predetermined position by using a photo resist, and impurity ion implantation is performed. After that, the resist mask is removed by asking. Subsequently, the same method of the ion implantation is performed to form the diffusion layers 115 (FIG. 9A). Next, in order to form the gate electrode 119a for transferring charges generated in the photoelectric conversion unit 114, a polysilicon film is formed. After that, a photolithography process is performed to form the polysilicon film into a predetermined pattern by etching, to thereby obtain the gate electrode 119a. Then, an interlayer insulating film, for example, a BPSG film is formed on the substrate 113 and the gate electrode 119a and is planarized by a CMP method (FIG. 9B). Then, a resist mask is formed and a reflow process is performed at approximately 160° C. to produce a resist 301 having a convex shape (FIG. 9C). After that, the convex shape of the resist is transferred to the interlayer insulating film by dry etching to form the convex insulating unit 117 (FIG. 9D).

Figure 9E:
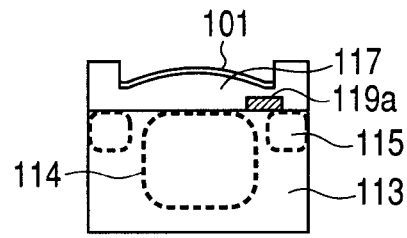
FIG. 9E illustrates a method of manufacturing a back illuminated CMOS imaging device according to Embodiment 3 of the present invention.
Figure 9B:
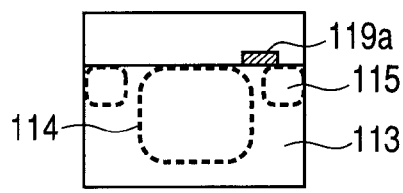
FIG. 9B illustrates a method of manufacturing a back illuminated CMOS imaging device according to Embodiment 3 of the present invention.
Figure 9F:
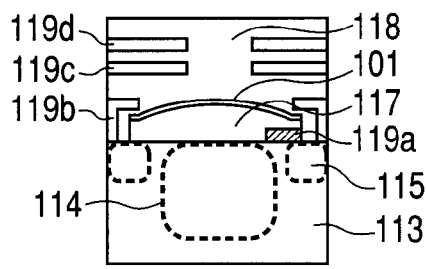
FIG. 9F illustrates a method of manufacturing a back illuminated CMOS imaging device according to Embodiment 3 of the present invention.
Figure 9C:
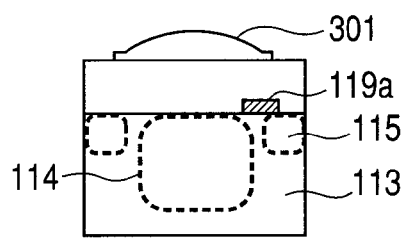
FIG. 9C illustrates a method of manufacturing a back illuminated CMOS imaging device according to Embodiment 3 of the present invention.
Figure 9G:
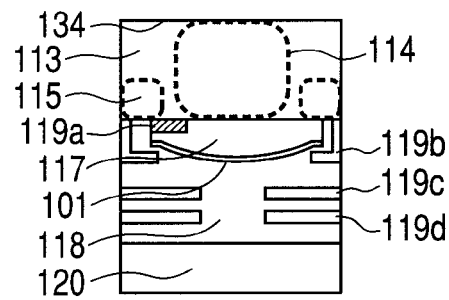
FIG. 9G illustrates a method of manufacturing a back illuminated CMOS imaging device according to Embodiment 3 of the present invention.
Figure 9D:
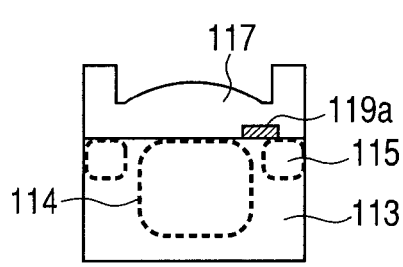
FIG. 9D illustrates a method of manufacturing a back illuminated CMOS imaging device according to Embodiment 3 of the present invention.
Figure 9H:
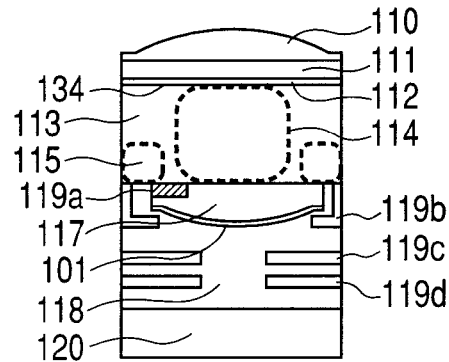
FIG. 9H illustrates a method of manufacturing a back illuminated CMOS imaging device according to Embodiment 3 of the present invention.

Subsequently, metal, for example, aluminum is deposited on the convex insulating unit 117 to form the reflecting unit 101 to which a shape of the convex insulating unit 117 is transferred (FIG. 9E). Next, for electrical connection, connection hole, for example, contact hole, is formed in the interlayer insulating film to make electrical connection with other metal wiring part. Similarly, the first wiring part 119b, the second wiring part 119c, and the third wiring part 119d are formed and covered with the interlayer insulating film 118 (FIG. 9F). Subsequently, the support substrate 120 is bonded to an upper portion of the interlayer insulating film 118. Then, the support substrate 120 is turned upside down and the substrate 113 is polished by a CMP method until a polished surface reaches a region in which the photoelectric conversion unit 114 is formed (FIG. 9G). Then, the insulating unit 112 is formed on the first surface 134 side of the substrate 113. If necessary, a light shielded film is formed (not shown). After that, the color filter 111 is formed on the insulating unit 112 side and the micro-lens 110 is formed by a reflow process (FIG. 9H).

In Embodiments 1 to 3 described above, a case of using the CMOS imaging device is described. However, the present invention is not limited to the CMOS imaging device. For example, the present invention may be applied to another solid-state imaging device including a CCD imaging device in the same manner.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-242053, filed Oct. 21, 2009, which is hereby incorporated by reference herein in its entirety.

What is claimed is:

1. A solid-state imaging device, comprising:
two dimensionally arranged pixels including a central pixel and a peripheral pixel, with each pixel comprising:
a wiring unit;
a photoelectric conversion unit formed in an inner portion of a substrate;
a condensing unit provided on a side of the substrate through which incident light enters, for condensing the incident light to the photoelectric conversion unit; and
a reflecting unit provided on a side of the substrate which is opposed to the condensing unit, the reflecting unit being concave to the substrate, wherein
the reflecting unit has a structure for substantially aligning a same magnification imaging position of the reflecting unit with a focusing position of the condensing unit,
in the peripheral pixel, the condensing unit is disposed to be shifted from a central axis of the peripheral pixel to the central pixel side so that the focusing position of the condensing unit is shifted to the central axis of the peripheral pixel,
the reflecting unit is located closer to the substrate than the wiring unit, and
the wiring unit is disposed to be shifted from the central axis of the peripheral pixel to a side opposed to the central pixel side.

2. The solid-state imaging device according to claim 1, wherein the reflecting unit is made of metal.

3. The solid-state imaging device according to claim 1, wherein the solid-state imaging device comprises a back illuminated solid-state imaging device, and the wiring unit is provided on the side of the substrate which is opposed to the condensing unit.

4. The solid-state imaging device according to claim 1, wherein the same magnification imaging position and the focusing position are located on a surface of the substrate which is located on a side at which the reflecting unit is provided.

5. The solid-state imaging device according to claim 1, wherein the wiring unit comprises a gate electrode and multiple wiring parts and, in the peripheral pixel, the gate electrode is disposed to be shifted from the central axis of the peripheral pixel to the central pixel side.

6. The solid-state imaging device according to claim 1, further comprising a gate electrode and multiple wiring parts, wherein the wiring unit comprises multiple wiring parts and, the multiple wiring parts are made of the same material as metal used to form the reflecting unit.

7. The solid-state imaging device according to claim 1, further comprising an antireflection layer formed between the substrate and the reflecting unit.

* * * * *